(12) United States Patent
Sugizaki

(10) Patent No.: US 11,240,452 B2
(45) Date of Patent: Feb. 1, 2022

(54) SOLID-STATE IMAGING DEVICE AND ELECTRONIC DEVICE INCLUDING LIGHT-SHIELDING FILM FOR SUPPRESSION OF LIGHT LEAKAGE TO MEMORY

(71) Applicant: SONY SEMICONDUCTOR SOLUTIONS CORPORATION, Kanagawa (JP)

(72) Inventor: Junji Sugizaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 154 days.

(21) Appl. No.: 16/614,967

(22) PCT Filed: May 10, 2018

(86) PCT No.: PCT/JP2018/018039
§ 371 (c)(1),
(2) Date: Nov. 19, 2019

(87) PCT Pub. No.: WO2018/216477
PCT Pub. Date: Nov. 29, 2018

(65) Prior Publication Data
US 2020/0204753 A1   Jun. 25, 2020

(30) Foreign Application Priority Data
May 24, 2017 (JP) .............................. JP2017-102661

(51) Int. Cl.
*H04N 5/3745* (2011.01)
*H01L 27/146* (2006.01)
(Continued)

(52) U.S. Cl.
CPC ........ *H04N 5/3745* (2013.01); *H01L 27/1464* (2013.01); *H01L 27/14623* (2013.01); *H01L 27/14643* (2013.01); *H04N 5/359* (2013.01)

(58) Field of Classification Search
CPC .. H04N 5/3745; H04N 5/359; H04N 5/37457; H04N 5/37452; H04N 5/369;
(Continued)

(56) References Cited

U.S. PATENT DOCUMENTS

2013/0070131 A1   3/2013 Ohkubo et al.
2014/0131779 A1   5/2014 Takeda
(Continued)

FOREIGN PATENT DOCUMENTS

JP   2013-065688   4/2013
JP   2014-096490   5/2014
(Continued)

OTHER PUBLICATIONS

International Search Report prepared by the Japan Patent Office dated May 25, 2018, for International Application No. PCT/JP2018/018039.
(Continued)

*Primary Examiner* — Albert H Cutler
(74) *Attorney, Agent, or Firm* — Sheridan Ross P.C.

(57) ABSTRACT

The present disclosure relates to a solid-state imaging device and an electronic device which efficiently capture incident light to improve sensitivity while maintaining the effect of suppressing noise generation. A memory is located on a side opposite from a light receiving surface and formed in the same substrate of Si as a photoelectric conversion element. The substrate including Si is defined by digging the Si deep from the light receiving surface, at a position where the memory is formed, and a bottom light-shielding film is formed at a bottom portion of the defined hole. The present disclosure is applicable to, for example, a stacked and back-illuminated solid-state imaging device.

14 Claims, 18 Drawing Sheets

(51) Int. Cl.
*H04N 5/359* (2011.01)
*H04N 5/369* (2011.01)

(58) Field of Classification Search
CPC ........... H01L 27/14623; H01L 27/1464; H01L 27/14643; H01L 27/14612; H01L 27/14685; H01L 27/14641; H01L 27/14656; H01L 27/1463; H01L 27/146
See application file for complete search history.

(56) References Cited

U.S. PATENT DOCUMENTS

| | | |
|---|---|---|
| 2015/0001660 A1 | 1/2015 | Fukumizu et al. |
| 2015/0256769 A1* | 9/2015 | Kim .................. H01L 27/14645 348/302 |
| 2016/0049430 A1 | 2/2016 | Nomura |
| 2016/0204150 A1* | 7/2016 | Oh .................... H01L 27/14638 257/229 |
| 2017/0117315 A1 | 4/2017 | Chen et al. |
| 2017/0141145 A1* | 5/2017 | Yamashita .......... H01L 27/1462 |
| 2018/0220086 A1* | 8/2018 | Hynecek .............. H04N 5/3592 |

FOREIGN PATENT DOCUMENTS

| | | |
|---|---|---|
| JP | 2015-012043 | 1/2015 |
| JP | 5794068 | 10/2015 |
| JP | 2017-085091 | 5/2017 |
| WO | WO 2014/158933 | 10/2014 |
| WO | WO 2016/136486 | 9/2016 |

OTHER PUBLICATIONS

Official Action (with English translation) for Japanese Patent Application No. 2017-102661, dated Nov. 17, 2020, 8 pages.

* cited by examiner

SOLID-STATE IMAGING DEVICE AND ELECTRONIC DEVICE INCLUDING LIGHT-SHIELDING FILM FOR SUPPRESSION OF LIGHT LEAKAGE TO MEMORY

CROSS REFERENCE TO RELATED APPLICATIONS

This application is a national stage application under 35 U.S.C. 371 and claims the benefit of PCT Application No. PCT/JP2018/018039 having an international filing date of 10 May 2018, which designated the United States, which PCT application claimed the benefit of Japanese Patent Application No. 2017-102661 filed 24 May 2017, the entire disclosures of each of which are incorporated herein by reference.

TECHNICAL FIELD

The present disclosure relates to a solid-state imaging device and an electronic device, and more particularly to a solid-state imaging device and an electronic device which efficiently capture incident light to improve sensitivity while maintaining the effect of suppressing noise generation.

BACKGROUND ART

Back-illuminated solid-state imaging devices each include a memory and a global shutter function, and the memory is located in silicon (Si) on a side opposite to a light receiving side (incident surface). If incident light leaks into the memory and the vicinity thereof, noise is caused in photoelectric conversion, and therefore a light-shielding film embedded in a groove arranged so as to surround the memory and a light-shielding film including a lid section configured to cover a surface of the memory are formed on an incident surface side (see Patent Document 1).

CITATION LIST

Patent Document

Patent Document 1: Japanese Patent No. 5794068

SUMMARY OF THE INVENTION

Problems to be Solved by the Invention

The light-shielding film arranged to suppress light leakage to the memory includes an embedded section embedded in the groove arranged in a wider area to surround the memory, and the lid section covering the surface of the memory. Therefore, an opening of a photo diode to the side irradiated with light is limited, and reduction in sensitivity is caused. Furthermore, electric charge generated in a portion surrounded by the light-shielding film is taken into the memory and causes noise.

The present disclosure has been made in view of such a situation and makes it possible to efficiently capture incident light to improve sensitivity while maintaining the effect of suppressing noise generation.

Solutions to Problems

A solid-state imaging device according to an aspect of the present technology includes a memory that is located on a side opposite from a light receiving surface and formed in the same substrate of Si as a photoelectric conversion element, and a bottom light-shielding film that is formed at a bottom portion of a hole defined by digging the Si deep from the light receiving surface, at a position where the memory is formed.

An electronic device according to an aspect of the present technology includes: a solid-state imaging device that includes: a memory that is located on a side opposite from a light receiving surface and formed in the same substrate of Si as a photoelectric conversion element; and a bottom light-shielding film that is formed at a bottom portion of a hole defined by digging the Si deep from the light receiving surface, at a position where the memory is formed; a signal processing circuit configured to process an output signal output from the solid-state imaging device; and an optical system configured to input incident light into the solid-state imaging device.

In an aspect of the present technology, a memory is located on a side opposite from a light receiving surface and formed in the same substrate of Si as a photoelectric conversion element, and a bottom light-shielding film is formed at a bottom portion of a hole defined by digging the Si deep from the light receiving surface, at a position where the memory is formed.

Effects of the Invention

According to the present technology, it is possible to efficiently capture incident light to improve sensitivity while maintaining the effect of suppressing noise generation.

Note that effects described in the present description are by way of example only, and the effects of the present technology are not limited to the effects described in the present description, and other effects may be added.

MODE FOR CARRYING OUT THE INVENTION

A mode for carrying out the present disclosure (hereinafter, referred to as embodiment) will be described below. Note that the description will be given in the following order.

0. Description of device
1. Embodiments
2. Examples of use of image sensor
3. Examples of electronic device
4. Examples of application to mobile body 0. Description of Device Example of Schematic Configuration of Solid-State Imaging Device FIG. 1 illustrates an example of a schematic configuration example of a complementary metal oxide semiconductor (CMOS) solid-state imaging device applied to each embodiment of the present technology.

Figure 1:
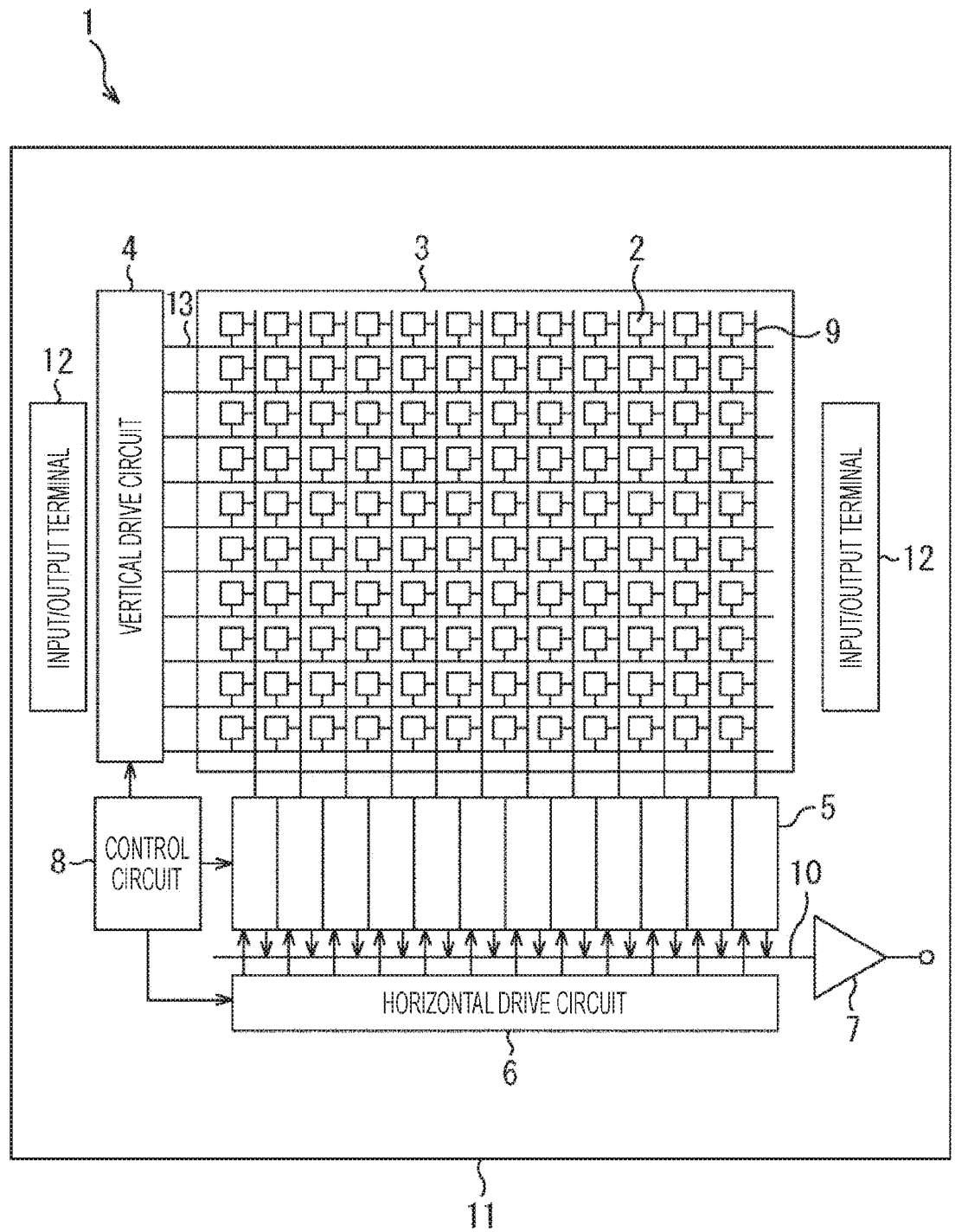
FIG. 1 is a block diagram schematically illustrating a configuration example of a solid-state imaging device to which the present technology is applied.

As illustrated in FIG. 1, the solid-state imaging device (device chip) 1 includes, in a semiconductor substrate 11 (e.g., silicon substrate), a pixel area (i.e., imaging area) 3 which has a two-dimensional regular arrangement of a plurality of pixels 2 each including a photoelectric conversion element, and a peripheral circuit area which is an area other than the pixel area 3.

Each of the plurality of pixels 2 includes a photoelectric conversion element (e.g., photo diode (PD)) and a plurality of pixel transistors (so-called MOS transistors). For example, the plurality of pixel transistors each can be constituted by three transistors, such as a transfer transistor, a reset transistor, and an amplifying transistor, and can be constituted by four transistors by further adding a selection transistor.

Furthermore, the pixels 2 can also have a shared pixel structure. The shared pixel structure includes a plurality of photo diodes PD, a plurality of transfer transistors, one shared floating diffusion, and each of the other shared pixel transistors.

The peripheral circuit area includes a vertical drive circuit 4, column signal processing circuits 5, a horizontal drive circuit 6, an output circuit 7, and a control circuit 8.

The control circuit 8 receives an input clock or data commanding an operation mode or the like and outputs data such as internal information of the solid-state imaging device 1. Specifically, the control circuit 8 generates a clock signal and a control signal which are a reference to the operations of the vertical drive circuit 4, the column signal processing circuit 5, and the horizontal drive circuit 6, on the basis of a vertical synchronization signal, a horizontal synchronization signal, and a master clock. Then, the control circuit 8 inputs these signals to the vertical drive circuit 4, the column signal processing circuit 5, and the horizontal drive circuit 6.

The vertical drive circuit 4 includes, for example, a shift register, selects a pixel drive wiring 13, supplies a pulse for driving pixels 2 to the selected pixel drive wiring 13, and drives the pixels 2 in a unit of row. Specifically, the vertical drive circuit 4 sequentially selects and scans each pixel 2 in the pixel area 3 in a unit of row in a vertical direction, generates electric charge according to the amount of received light in the photoelectric conversion element of each pixel 2 through the vertical signal line 9, and supplies a pixel signal based on the generated electric charge to the column signal processing circuit 5.

The column signal processing circuits 5 are arranged, for example, for columns of the pixels 2 and each perform signal processing, such as noise removal, on a signal output from the pixel 2 in a row for each pixel column. Specifically, the column signal processing circuit 5 performs signal processing, such as correlated double sampling (CDS) for removing fixed pattern noise unique to each pixel 2, signal amplification, or analog/digital (A/D). At an output stage of the column signal processing circuit 5, a horizontal selection switch (not illustrated) is provided to be connected between the column signal processing circuit 5 and a horizontal signal line 10. Note that portion of the signal processing described above is performed for each column, but may be performed for each pixel.

The horizontal drive circuit 6 includes, for example, a shift register, sequentially outputs a horizontal scanning pulse to the column signal processing circuits 5, selects the column signal processing circuits 5 in order, and causes each of the column signal processing circuits 5 to output the pixel signal to the horizontal signal line 10.

The output circuit 7 performs signal processing on the pixel signals sequentially supplied from the column signal processing circuits 5 through the horizontal signal line 10 and outputs the pixel signals. For example, the output circuit 7 may perform only buffering or may perform black level adjustment, column variation correction, various digital signal processing, and the like.

An input/output terminal 12 is provided to exchange signals with an external device.

1. Embodiments

Example of Pixel Structure of Solid-State Imaging Device

Figure 2:
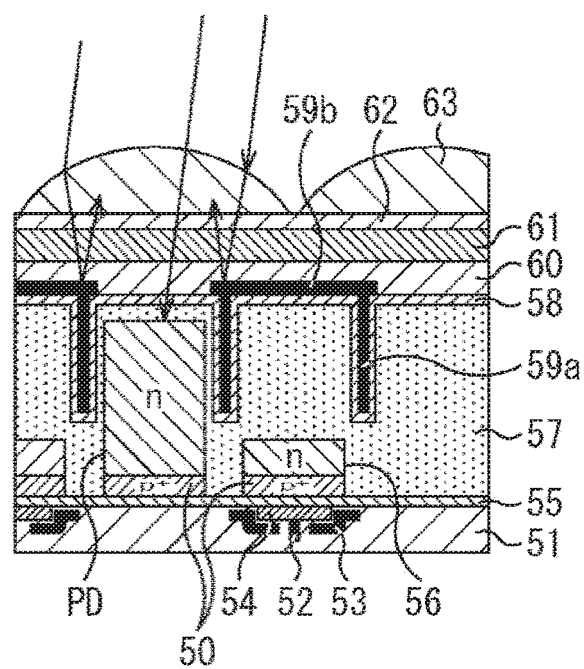
FIG. 2 is a cross-sectional view of an example of a pixel structure in an embodiment of a solid-state imaging device for comparison with the present technology.
Figure 3:
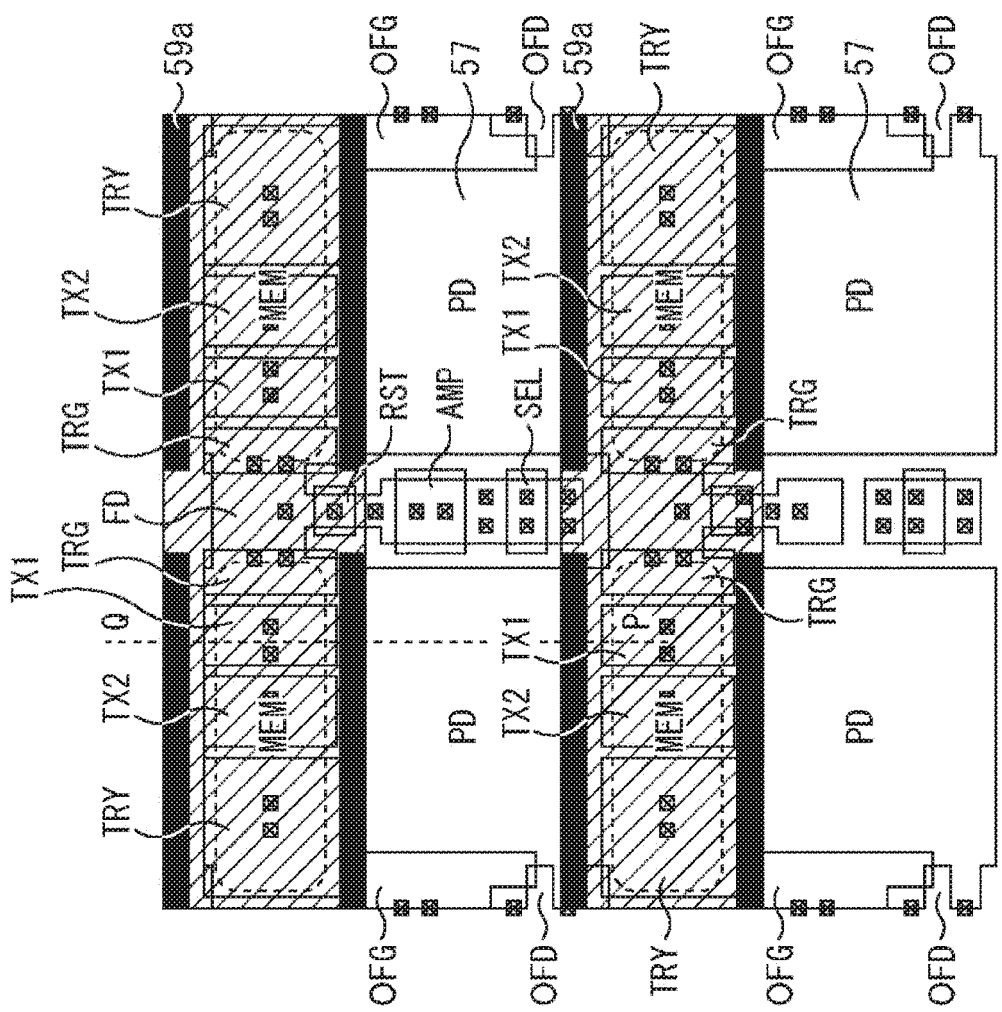
FIG. 3 is a plan view of an example of a pixel structure in an embodiment of a solid-state imaging device for comparison with the present technology.
Figure 4:
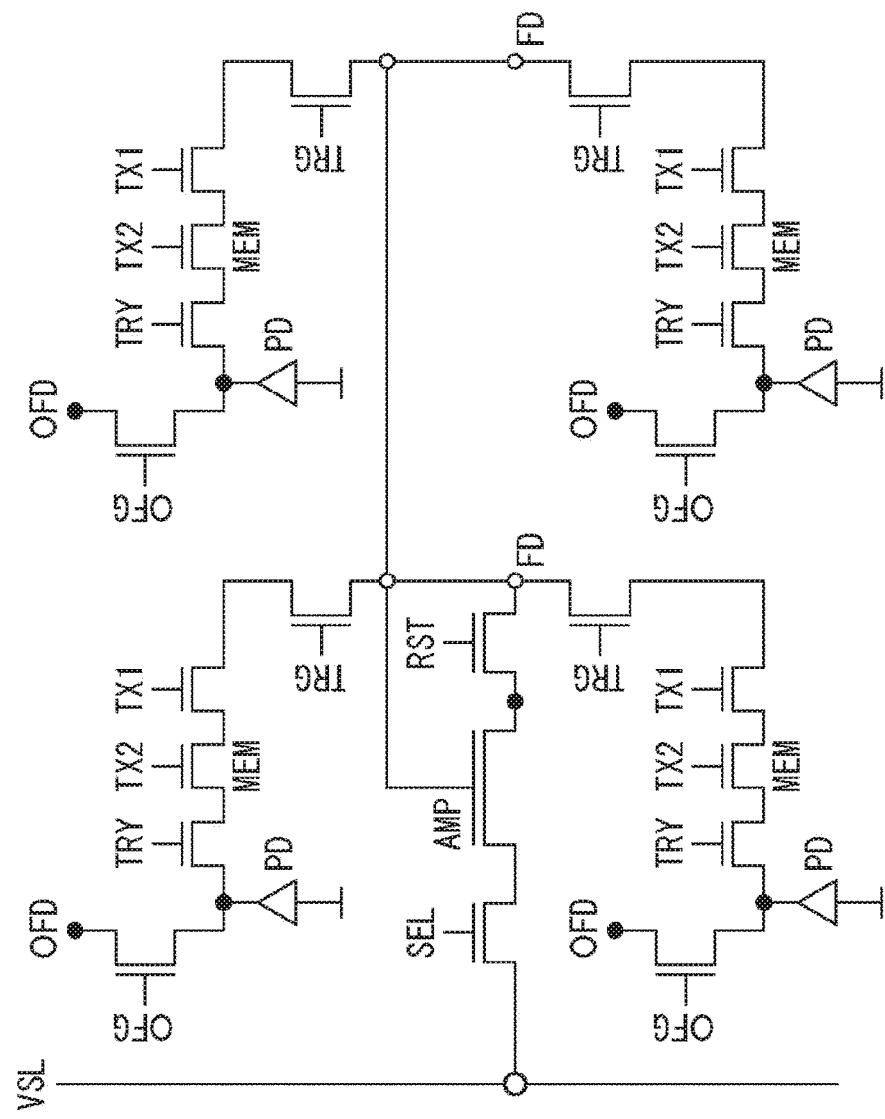
FIG. 4 is an equivalent circuit diagram illustrating an example of a pixel structure.

FIGS. 2 to 4 are diagrams each illustrating an example of a pixel structure in an embodiment of a solid-state imaging device for comparison with the present technology. FIG. 2 is a cross-sectional view of an example of a pixel structure, and FIG. 3 is a plan view of an example of a pixel structure before a planarization film 60 is formed. FIG. 2 is a cross-sectional view taken along a PQ plane of FIG. 3 FIG. 4 is an equivalent circuit diagram of pixels 2, and FIG. 3 shows each element of a circuit configuration of FIG. 4.

The solid-state imaging device having the pixel structure illustrated in FIG. 2 is a back-illuminated solid-state imaging device including a memory 56 and having a global shutter function. In the solid-state imaging device of FIG. 2, the memory 56 is located in Si 57 where the photo diode PD is formed on a side opposite to the light receiving side. In addition, p+ surface pinning layers 50 are formed on a side (lower side in FIG. 2) opposite to the light receiving side of the photo diode PD in an n-type region and the memory 56 in an n-type region. An insulating film 55 is formed below the surface pinning layers 50, and a polysilicon electrode 54, a light-shielding film 53, and a wiring 52 are arranged below the insulating film 55 and are planarized using a planarization film 51. Note that, although not illustrated in the example of FIG. 2, actually, a photo diode PD in an n-type region and a p+ surface pinning layer 50 are formed also on the right side in the Si 57. The same applies to the subsequent cross-sectional views.

Incident light leaking into the memory 56 and the vicinity thereof and subjected to photoelectric conversion causes noise. Therefore, the incident surface includes a light-shielding film 59a and a light-shielding film 59b (the light-shielding film 59a and the light-shielding film 59b are collectively referred to as a light-shielding film 59). The light-shielding film 59a is embedded in a groove arranged to surround the memory 56 and provided with an oxide film (insulating film) 58, and the light-shielding film 59b serves as a lid section configured to cover the surface of the memory 56. The planarization film 60, a color filter film 61, and a resin film 62 are formed above the light-shielding film 59, and finally an on chip lens (OCL) 63 is arranged thereon.

As illustrated in FIG. 4, in the solid-state imaging device 1, the pixels 2 has, for example, a 4-shared pixel structure. In other words, the 4-shared pixel structure includes the photo diode PD, a first transfer transistor TX1, a second transfer transistor TX2, a third transfer transistor TRY, a fourth transfer transistor TRG, an overflow gate OFG, and an overflow drain OFD of each pixel 2, and further includes a shared selection transistor SEL, a shared amplification transistor AMP, a shared reset transistor RST, and a shared floating diffusion FD. In FIG. 4, a memory (MEM) 56 is illustrated below the second transfer transistor TX2, but is actually provided between the first transfer transistor TX1 and the fourth transfer transistor TRG.

The photo diode PD receives light applied to the pixel 2, generates electric charge according to the amount of the light, and accumulates the electric charge. The first transfer transistor TX1, the second transfer transistor TX2, and the third transfer transistor TRY are driven according to a control signal supplied from the vertical drive circuit 4. When each of the transfer transistors is turned on, electric charge from the photo diode PD is transferred to each memory (MEM) 56. The fourth transfer transistor TRG is driven according to a control signal supplied from the vertical drive circuit 4. When the fourth transfer transistor TRG is turned on, electric charge from the memory 56 is transferred to the floating diffusion FD. The floating diffusion FD is a floating diffusion region formed at a connection point between the fourth transfer transistor TRG and the gate electrode of the amplification transistor AMP and having a predetermined capacity, and the floating diffusion FD accumulates electric charge transferred from the memory 56 via the fourth transfer transistor TRG.

The overflow drain OFD is connected to an unillustrated constant voltage source VDD, which is not illustrated, via the overflow gate OFG to which a control signal is supplied from the vertical drive circuit 4, for resetting the photo diode PD. The reset transistor RST is driven according to a control signal supplied from the vertical drive circuit 4, and when the reset transistor RST is turned on, electric charge accumulated in the floating diffusion FD is discharged via the reset transistor RST to the unillustrated power supply VDD, and the floating diffusion FD is reset.

The amplification transistor AMP is connected to the unillustrated power supply VDD. The amplification transistor AMP outputs a pixel signal having a level according to electric charge accumulated in the floating diffusion FD. The selection transistor SEL is driven according to a control signal supplied from the vertical drive circuit 4, and when the selection transistor SEL is turned on, a pixel signal output from the amplification transistor AMP is changed so as to be read out to the vertical signal line VSL (vertical signal line 10) via the selection transistor SEL.

In the solid-state imaging device 1 having the 4-shared pixel structure as described above, the global shutter function is adopted, and electric charge can be transferred from the photo diodes PD to the memories 56 simultaneously for all pixel signals, enabling exposure of all pixels at the same timing. Therefore, image distortion is prevented. Note that the pixels 2 do not necessarily have the shared pixel structure.

In FIG. 2, the light-shielding film 59 arranged to suppress light leakage to the memory 56 includes the light-shielding film 59a which serves as an embedded section embedded in a groove arranged in a larger area than that of the memory 56 to surround the memory 56, and the light-shielding film 59b that serves as the lid section configured to cover the surface of the memory 56.

In FIG. 3, only the memories 56 and the light-shielding films 59a arranged beside the transistors are illustrated, but actually, the surfaces of the memories 56 and the transistors are covered by the light-shielding films 59b provided at positions closer to the incident surface.

Each of the light-shielding films 59 arranged in this way forms a higher wall for shielding light incidence, an opening for a photo diode PD on the light incident side is limited, and sensitivity thereof is reduced. In addition, electric charge generated in a portion surrounded by the light-shielding film 59 is taken into the memory and generates a noise.

Figure 5:
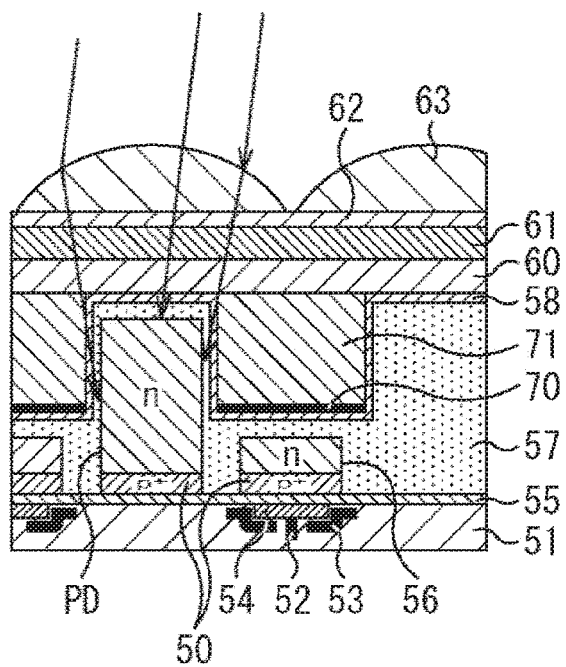
FIG. 5 is a cross-sectional view of an example of a pixel structure in a first embodiment of a solid-state imaging device to which the present technology is applied.
Figure 6:
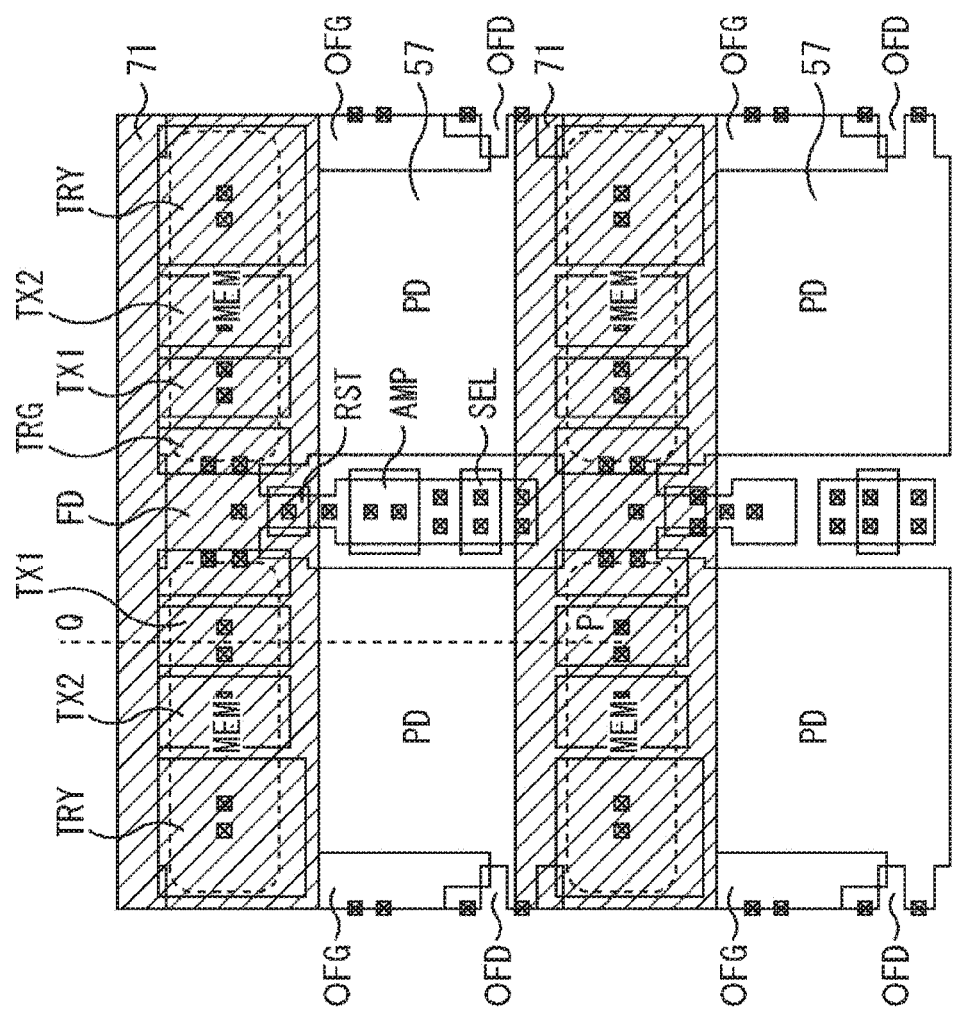
FIG. 6 is a plan view of an example of a pixel structure in the first embodiment of the solid-state imaging device to which the present technology is applied.

FIGS. 5 and 6 are diagrams each illustrating an example of a pixel structure in a first embodiment of the solid-state imaging device to which the present technology is applied. FIG. 5 is a cross-sectional view of an example of a pixel structure, and FIG. 6 is a plan view of an example of a pixel structure before a planarization film 60 is formed. FIG. 5 is a cross-sectional view taken along a PQ plane of FIG. 6 Note that FIG. 4 described above is the equivalent circuit diagram of pixels 2, and FIG. 6 shows each element of the circuit configuration of FIG. 4. Portions corresponding to those in FIGS. 2 to 4 are denoted by the same reference numerals.

The solid-state imaging device having the pixel structure illustrated in FIG. 5 is a back-illuminated solid-state imaging device including a memory 56 and having a global shutter function, as in the solid-state imaging device of FIG. 2. In the solid-state imaging device of FIG. 5, the memory 56 is located in Si 57 where a photo diode PD is formed on a side opposite to a light receiving side. An insulating film 55 is formed below the memory 56 (on a side opposite to the irradiation side), and a polysilicon electrode 54, a light-shielding film 53, and a wiring 52 are arranged below the insulating film 55 and are planarized using a planarization film 51.

In the solid-state imaging device having the pixel structure illustrated in FIG. 5, unlike the solid-state imaging device of FIG. 2, the Si 57 on the light receiving side above the memory 56 is dug, and an oxide film 58 is provided at a bottom portion of the dug portion (hole), and a light-shielding film 70 is formed over the oxide film 58. Then, the dug portion is filled with an oxide film 71, the planarization film 60, a color filter film 61, and a resin film 62 are formed thereon, and finally an OCL 63 is arranged.

In FIG. 6, the Si 57 on the light receiving side above the memory 56 is dug, the oxide film 58 is provided at a bottom portion of the dug portion (hole), the light-shielding film 70 is formed over the oxide film 58, and the dug portion where the oxide film 71 is embedded is shown.

In other words, the light-shielding film 70 is formed at a position deeper than the depth of the surface (incident surface) on the light receiving side. Therefore, it is possible to more efficiently capture light into the photo diode PD while suppressing light incidence to the memory 56.

In addition, since the Si 57 on the light receiving side above the memory 56 is dug, Si around the memory 56 is removed, and a portion surrounded by the light-shielding film is reduced, enabling the reduction of the number of charge generation sources.

Note that the oxide film 71 and the planarization film 60 may include the same material, and in that case, one process step can be reduced.

Example of Manufacturing Process for Solid-State Imaging Device

Figure 7:
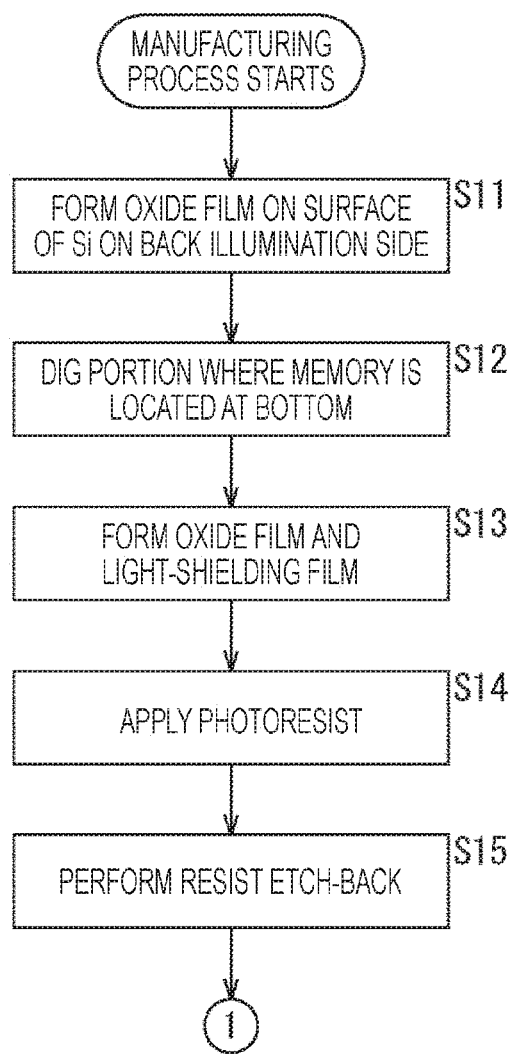
FIG. 7 is a flowchart illustrating a manufacturing process for a solid-state imaging device.
Figure 8:
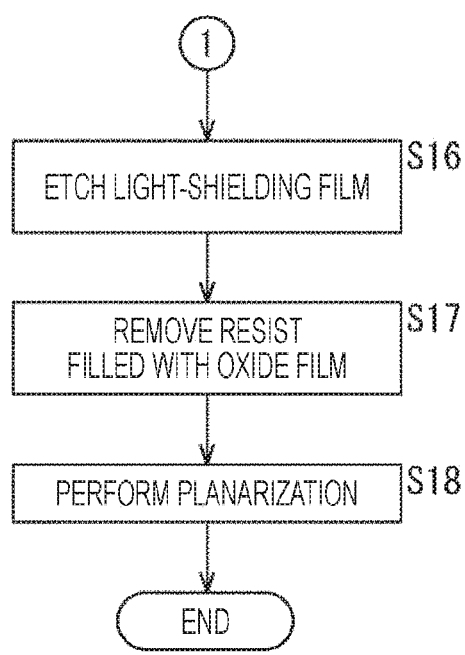
FIG. 8 is a flowchart illustrating a manufacturing process for a solid-state imaging device.
Figure 9:
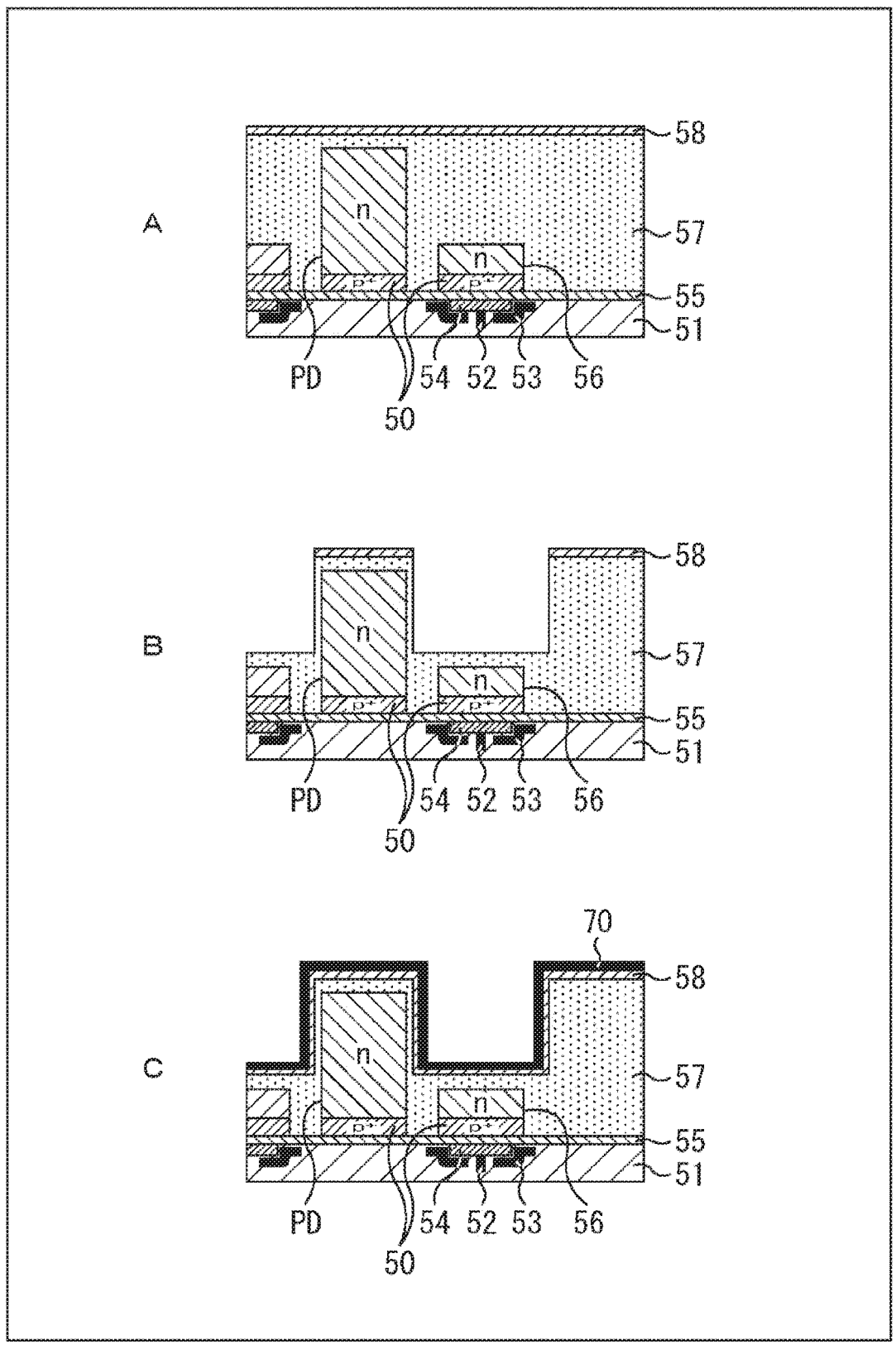
FIG. 9 is a process diagram illustrating a manufacturing process for a solid-state imaging device.
Figure 10:
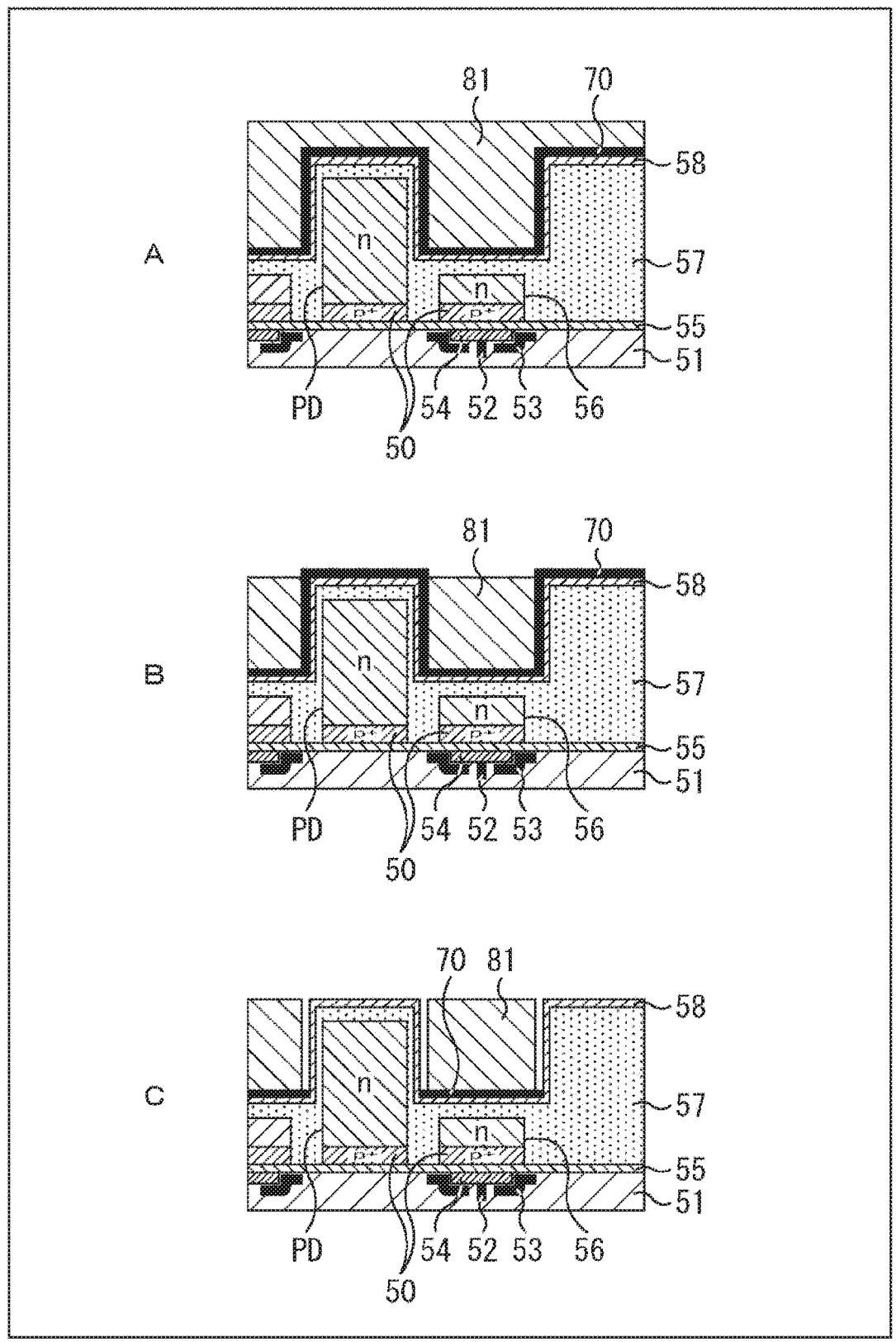
FIG. 10 is a process diagram illustrating a manufacturing process for a solid-state imaging device.
Figure 11:
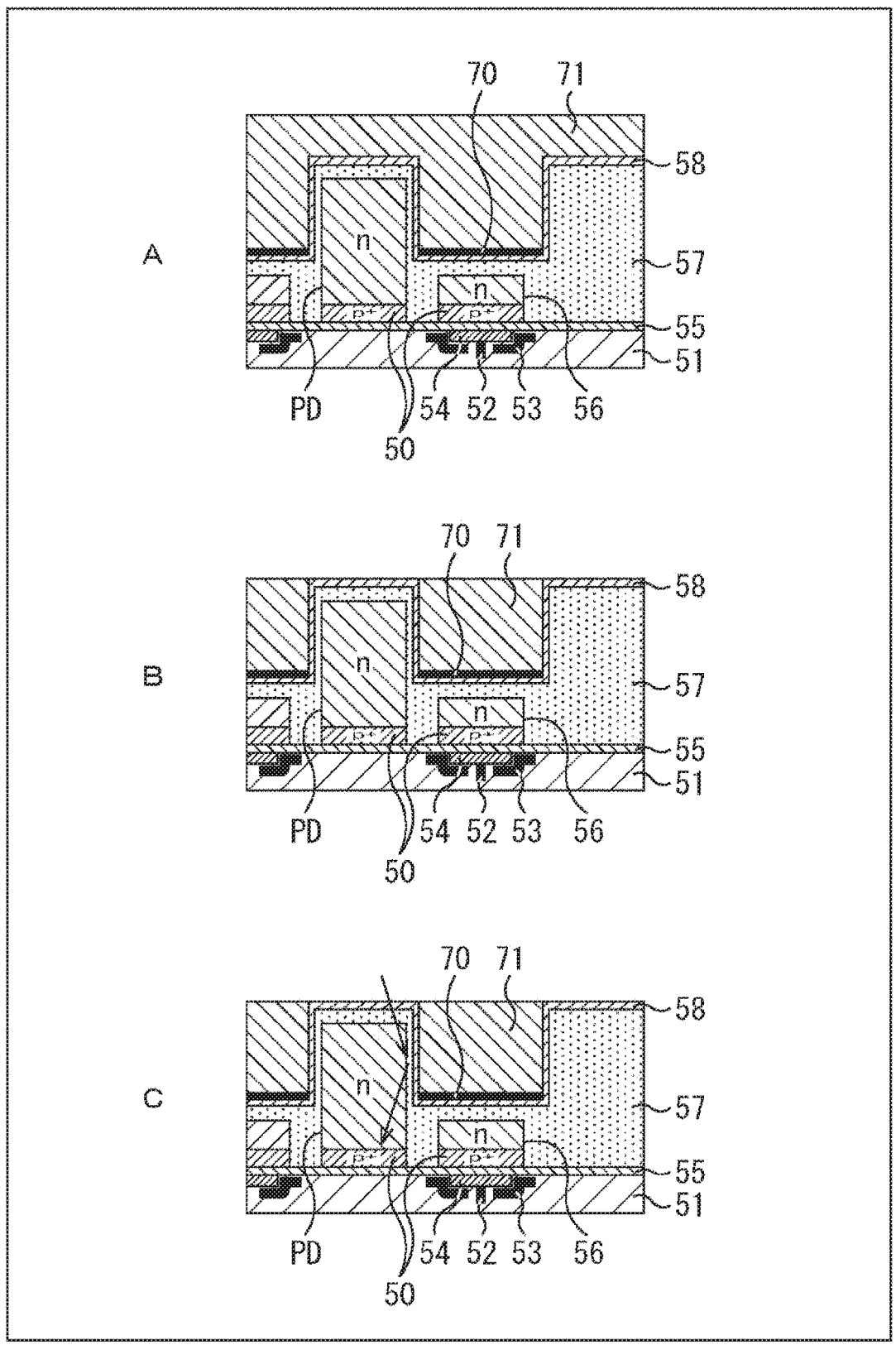
FIG. 11 is a process diagram illustrating a manufacturing process for a solid-state imaging device.

Next, a manufacturing process for the solid-state imaging device having the structure of FIG. 5 will be described with reference to the flowcharts of FIGS. 7 and 8. Note that this manufacturing process has a process performed by a manufacturing apparatus, and process diagrams of FIGS. 9 to 11 are referred to as appropriate. Note that in the Si 57, the surface pinning layer 50, the photo diode PD, and the memory 56 are formed by implantation of high-concentration impurity ions.

Firstly, in step S11, the manufacturing apparatus forms the oxide film 58 on a surface of the Si 57 on the back illumination side of the solid-state imaging device (A of FIG. 9). Note that in the solid-state imaging device in A of FIG. 9, as described above with reference to FIG. 5, the memory 56 is located in the Si 57 where the photo diode PD is formed on the side opposite to the light receiving side. The insulating film 55 is formed below the memory 56 (on the side opposite to the irradiation side), and the polysilicon electrode 54, the light-shielding film 53, and the wiring 52 are arranged below the insulating film 55 and are planarized using the planarization film 51. The oxide film 58 includes, for example, a SiO2 film and the like.

In step S12, the manufacturing apparatus digs Si 57 at a portion where the memory 56 is located at a bottom portion thereof to define a hole (B of FIG. 9). In step S13, the manufacturing apparatus forms the oxide film 58 and the light-shielding film 70 (C of FIG. 9).

In step S14, the manufacturing apparatus applies photoresist 81 (A of FIG. 10). In step S15, the manufacturing apparatus performs resist etch-back to reduce the height of the photoresist 81 to the depth of the oxide film 58 (B of FIG. 10). In step S16, the manufacturing apparatus etches the light-shielding film 70 up to the bottom (C of FIG. 10).

In step S17, the manufacturing apparatus removes the photoresist 81 and embeds the oxide film 71 in a hole formed by removing the photoresist 81 (A of FIG. 11). Note that the oxide film 71 is not limited to the SiO2 film and is only required to be a SiN, SiON, resin film, or the like that has light transparency.

In step S18, the manufacturing apparatus planarizes the oxide film 71 (B of FIG. 11). Note that in a case where a film (oxide film 71) to be embedded is an oxide film or the like having a refractive index smaller than that of the Si 57, a sensitivity improvement effect is also expected owing to the total reflection of light, as indicated by an arrow C of FIG. 11.

As described above, after the oxide film 71 is planarized, the planarization film 60, the color filter film 61, and the resin film 62 are formed on the oxide film 71 as described above with reference to FIG. 5, and finally the OCL 63 is arranged thereon.

Other Examples of Pixel Structure of Solid-State Imaging Device

Figure 12:
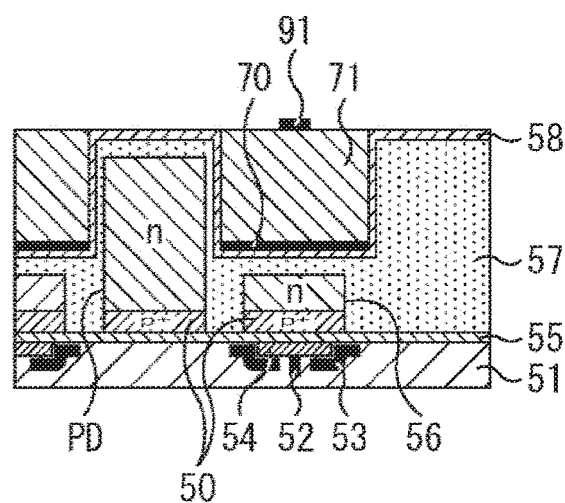
FIG. 12 is a cross-sectional view of an example of a pixel structure in a second embodiment of the solid-state imaging device to which the present technology is applied.

FIG. 12 is a cross-sectional view of an example of a pixel structure in a second embodiment of the solid-state imaging device to which the present technology is applied. Portions corresponding to those in FIG. 5 are denoted by the same reference numerals. Note that after an oxide film 71 is planarized, a light-shielding film 91 may be added between the photo diodes PD as illustrated in FIG. 12. In this case, color mixture can be suppressed.

Figure 13:
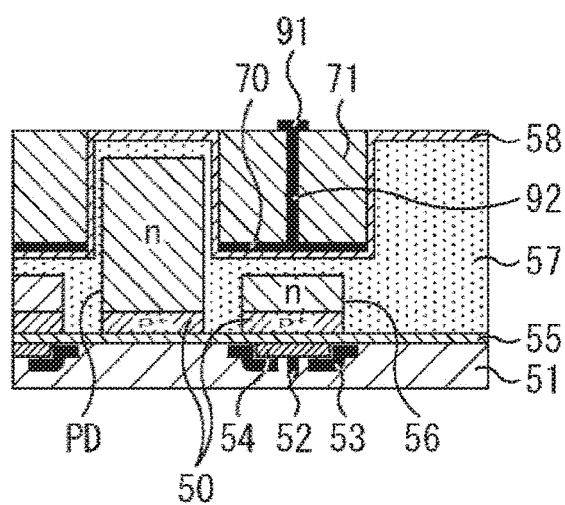
FIG. 13 is a cross-sectional view of an example of a pixel structure in a third embodiment of the solid-state imaging device to which the present technology is applied.

FIG. 13 is a cross-sectional view of an example of a pixel structure in a third embodiment of the solid-state imaging device to which the present technology is applied. Portions corresponding to those in FIG. 5 are denoted by the same reference numerals. Furthermore, in addition to the light-shielding film 91 of FIG. 12, a digging light-shielding film 92 may be added as illustrated in FIG. 13.

Figure 14:
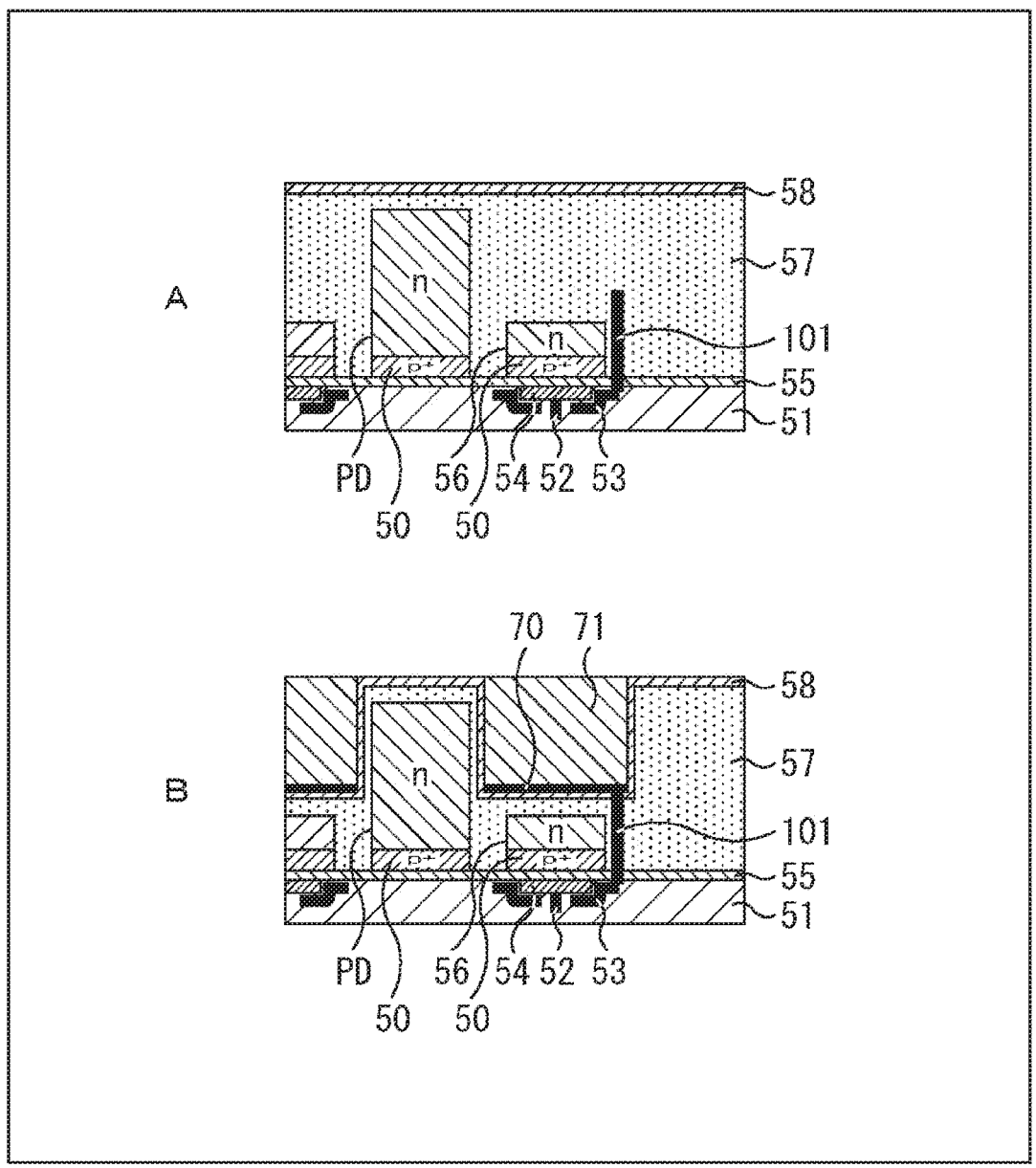
FIG. 14 is a cross-sectional view of an example of a pixel structure in a fourth embodiment of a solid-state imaging device to which the present technology is applied.

FIG. 14 is a cross-sectional view of an example of a pixel structure in a fourth embodiment of the solid-state imaging device to which the present technology is applied. Portions corresponding to those in FIG. 5 are denoted by the same reference numerals. Furthermore, as illustrated in A of FIG. 14, a light-shielding film 101 may be embedded in advance in the vicinity of a memory 56 from a side opposite to the light receiving side (lower side in the figure). With this configuration, light-shielding effect can be enhanced. Furthermore, as illustrated in B of FIG. 14, a portion above the memory 56, which is characterized by the present technology, is dug, an oxide film 58 is provided, a light-shielding film 70 is formed thereon, and the dug portion is filled with an oxide film 71. At this time, the formed light-shielding film 70 may be connected to the light-shielding film 101 embedded on the side of the memory 56.

Note that both of the light-shielding film 91 in FIG. 12 or the digging light-shielding film 92 of FIG. 13 and the light-shielding film 101 of FIG. 14 may be formed.

Figure 15:
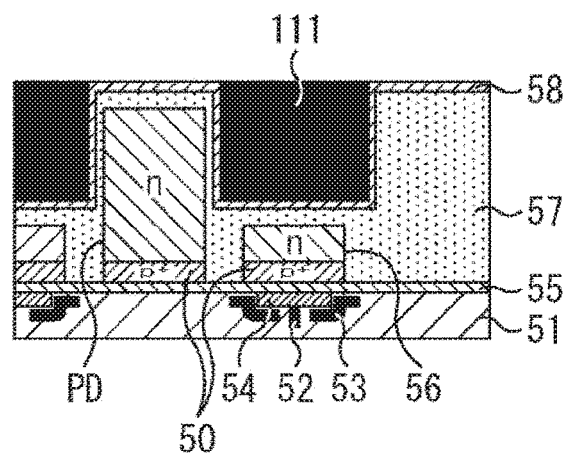
FIG. 15 is a cross-sectional view of an example of a pixel structure in a fifth embodiment of the solid-state imaging device to which the present technology is applied.

FIG. 15 is a top view of an example of a pixel structure in a fifth embodiment of the solid-state imaging device to which the present technology is applied. Portions corresponding to those in FIG. 5 are denoted by the same reference numerals. As illustrated in FIG. 15, a portion above a memory 56 is dug, an oxide film 58 may be provided, and a light-shielding film 111 may be embedded entirely in the dug portion.

As described above, according to the present technology, the light-shielding film, which functions as a lid for blocking a memory signal, is formed deep inside from a surface on the light incident side, and thus, light leakage to the memory signal is inhibited, incident light is efficiently captured while maintaining the effect of suppressing generation of a noise signal, and the sensitivity is improved. Furthermore, by removing a Si region in the vicinity of the memory, the number of charge generation sources can be reduced, and noise can be reduced.

2. Examples of Use of Image Sensor

Figure 16:
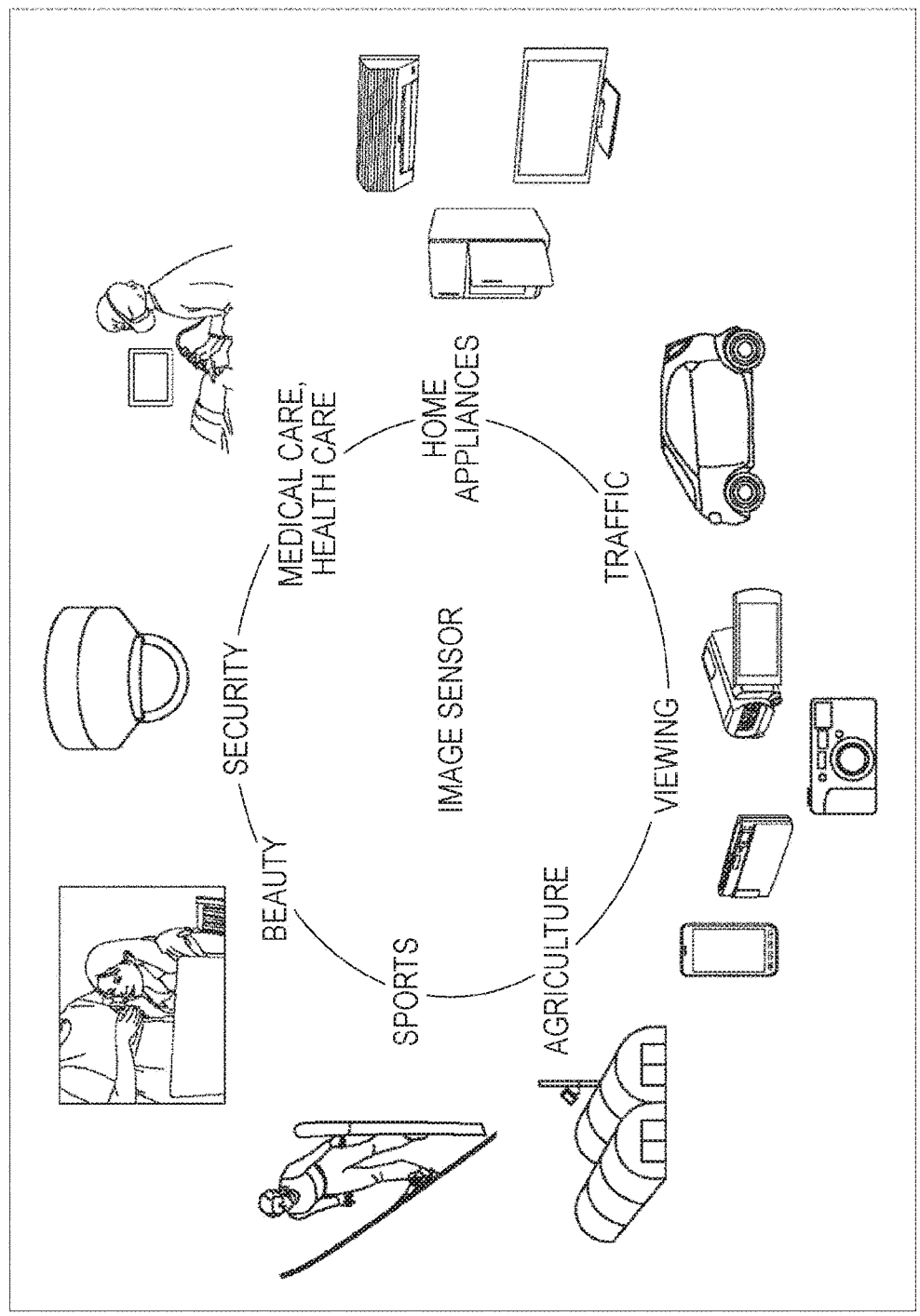
FIG. 16 is a diagram illustrating a use example of an image sensor to which the present technology is applied.

FIG. 16 is a diagram illustrating a use example of a solid-state imaging device described above.

The solid-state imaging device (image sensor) described above can be used for various cases for sensing light, such as visible light, infrared light, ultraviolet light, or X-ray, as described below, for example.

- A device for capturing an image for viewing, such as a digital camera or a portable device with camera function;
- A traffic-related device, such as a car sensor capturing an image of forward, backward, or peripheral position of a car, inside a car, or the like, for safe driving such as automatic stop, recognition of driver's condition, or the like, a monitoring camera monitoring a running vehicle or a road, or a distance measuring sensor measuring a distance between vehicles, or the like;
- A device used for a home electrical appliance, such as a TV set, refrigerator, or air conditioner, which captures user's gesture and is operated according to captured user's gesture;
- A device for medical care or health care, such as an endoscope or an angiographic device using infrared light;
- A security device, such as a monitoring camera for security or a camera for personal identification;
- A device for beauty, such as a skin measurement device capturing a skin image or a microscope capturing a scalp image;
- A device for sport use, such as an action camera or a wearable camera for sport use or the like; and
- A device for agricultural use, such as a camera monitoring field condition or crop condition.

3. Examples of Electronic Device

Configuration Example of Electronic Device

Furthermore, the present technology is not limited to application to the solid-state imaging device and also applicable to an imaging apparatus. Here, the imaging apparatus refers to a camera system, such as a digital still camera or digital video camera, or an electronic device having an imaging function, such as a mobile phone. Note that, in some cases, a module form to be mounted to an electronic device, that is, a camera module is also referred to as an imaging device.

Here, a configuration example of an electronic device according to the present technology will be described with reference to FIG. 17.

Figure 17:
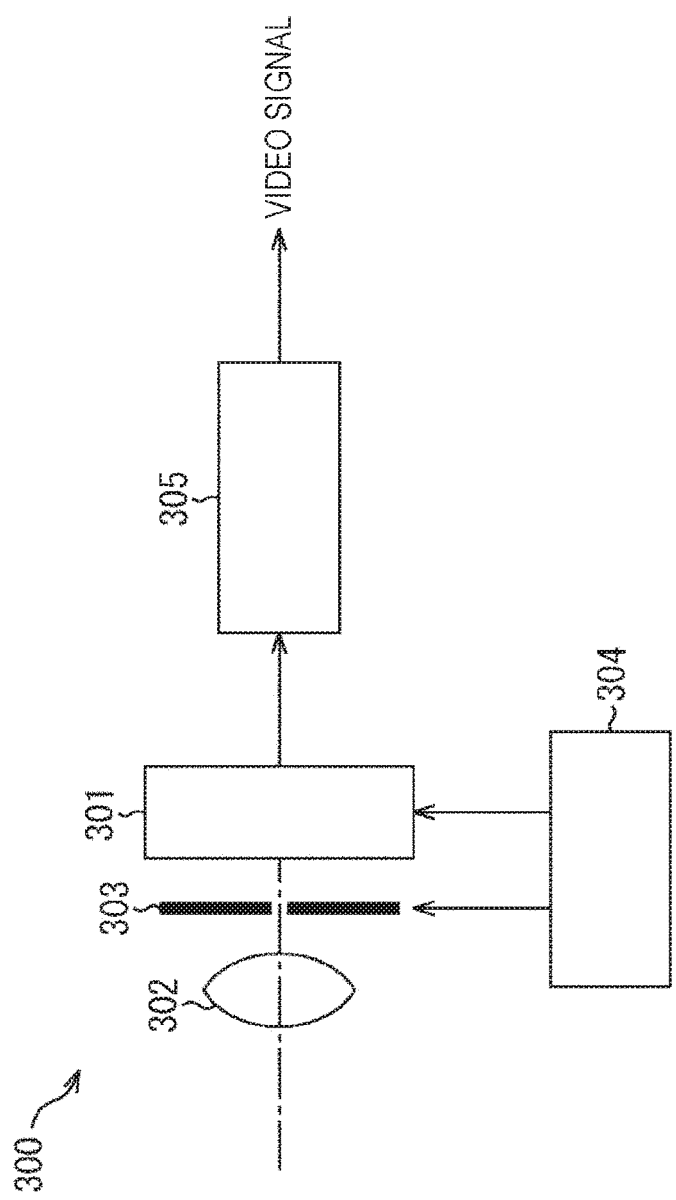
FIG. 17 is a block diagram illustrating a configuration example of an electronic device to which the present technology is applied.

An electronic device 300 illustrated in FIG. 17 includes a solid-state imaging device (device chip) 301, an optical lens 302, a shutter device 303, a drive circuit 304, and a signal processing circuit 305. As the solid-state imaging device 301, for example, the solid-state imaging device illustrated in FIG. 5 is provided.

The optical lens 302 focuses image light (incident light) from an object on an imaging surface of the solid-state imaging device 301. Therefore, signal charge is accumulated in the solid-state imaging device 301 for a certain period.

The shutter device 303 controls a light receiving period and a light-shielding period of the solid-state imaging device 301.

The drive circuit 304 supplies drive signals controlling a signal transfer operation of the solid-state imaging device 301, a shutter operation of the shutter device 303, and a light emission operation of a light emission unit (not illustrated). The drive circuit 304 controls the operations by using parameters set by a CPU (not illustrated). The solid-state imaging device 301 transfers a signal by a drive signal (timing signal) supplied from the drive circuit 304. The signal processing circuit 305 performs various signal processing on a signal output from the solid-state imaging device 301. A video signal subjected to signal processing is stored in a storage medium such as a memory or output to a monitor.

4. Examples of Application to Mobile Body

A technology according to the present disclosure (the present technology) is applicable to various products. For example, the technology according to the present disclosure may be achieved as a device that is mounted to any type of mobile body, such as an automobile, electric vehicle, hybrid-electric vehicle, motorcycle, a bicycle, personal mobility vehicle, airplane, drone, ship, and robot.

Figure 18:
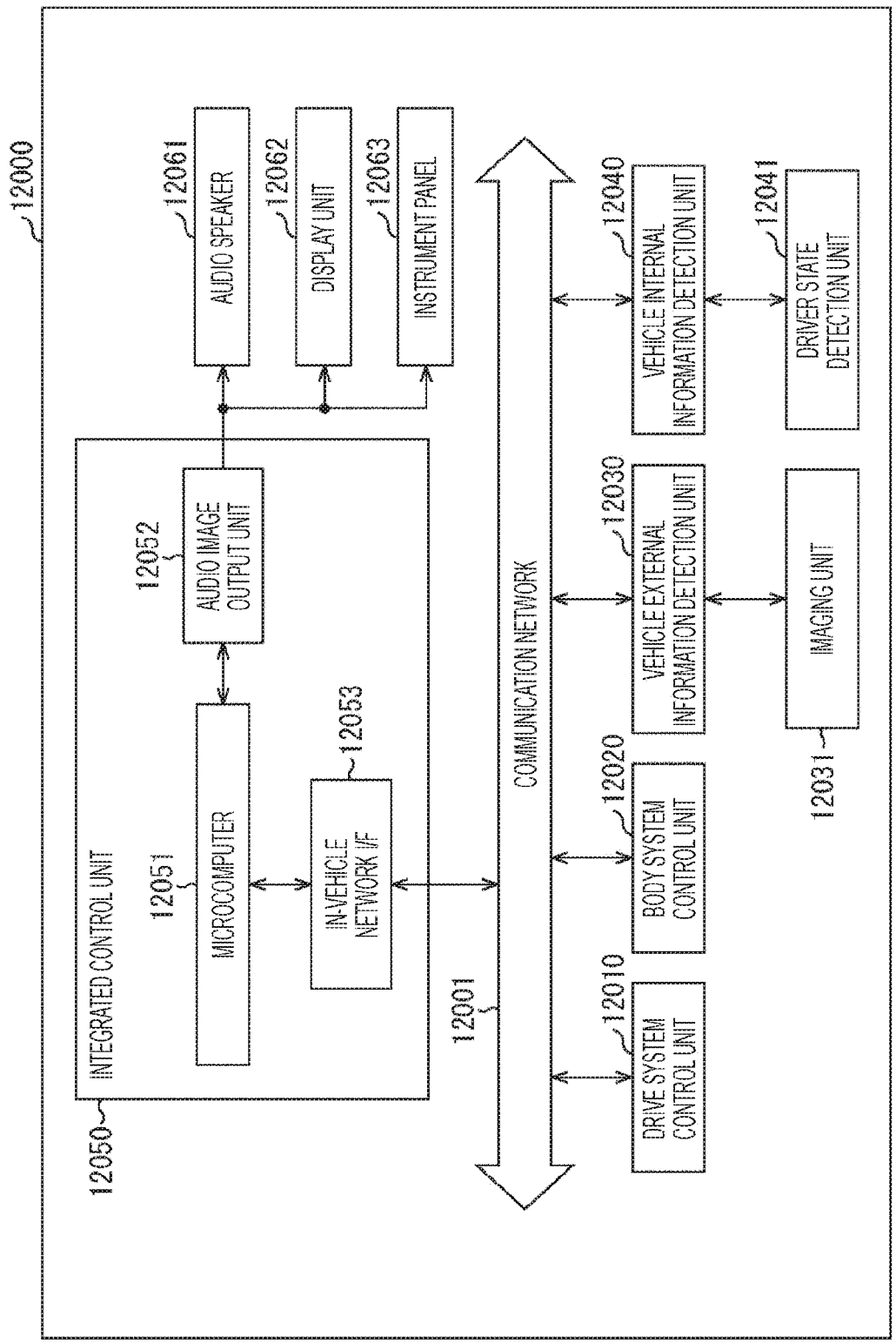
FIG. 18 is a block diagram illustrating an example of a schematic configuration of a vehicle control system.

FIG. 18 is a block diagram illustrating a schematic configuration example of a vehicle control system that is an example of a mobile body control system to which a technology according to the present disclosure is applicable.

The vehicle control system 12000 includes a plurality of electronic control units that is connected via a communication network 12001. In the example illustrated in FIG. 18, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, an audio image output unit 12052, and an in-vehicle network I/F (interface) 12053 are illustrated.

The drive system control unit 12010 controls the operation of a device relating to the drive system of the vehicle according to various programs. For example, the drive system control unit 12010 functions as a control device for a driving force generation device configured to generate a driving force of a vehicle, such as an internal combustion engine or driving motor, a driving force transmission mechanism configured to transmit a driving force to wheels, a steering mechanism configured to adjust a steering angle of the vehicle, a braking device configured to generate a braking force of the vehicle, and the like.

The body system control unit 12020 controls the operation of various devices mounted to the vehicle body according to various programs. For example, the body system control unit 12020 functions as a control device for a keyless entry system, smart key system, power window device, or various lamps, such as a head lamp, backup lamp, brake lamp, blinker, or fog lamp. In this case, the body system control unit 12020 receives input of a radio wave transmitted from a portable device substituting for a key or signals from various switches. The body system control unit 12020 receiving input of the radio wave or signals controls a door lock device, power window device, a lamp, and the like of the vehicle.

The vehicle external information detection unit 12030 detects information outside the vehicle on which the vehicle control system 12000 is mounted. For example, an imaging unit 12031 is connected to the vehicle external information detection unit 12030. The vehicle external information detection unit 12030 causes the imaging unit 12031 to capture an image outside the vehicle and receives the captured image. The vehicle external information detection unit 12030 may perform object detection processing for detecting an object, such as a person, car, obstacle, traffic sign, or writing on a road surface or distance detection processing, on the basis of the captured image.

The imaging unit 12031 includes an optical sensor configured to receive light and output an electric signal according to an amount of the received light. The imaging unit 12031 is operable to output an electric signal as an image or as distance measurement information. In addition, light received by the imaging unit 12031 may be visible light or invisible light such as infrared light.

The vehicle internal information detection unit 12040 detects information inside the vehicle. For example, a driver state detection unit 12041 configured to detect a driver's state is connected to the vehicle internal information detection unit 12040. The driver state detection unit 12041 may include, for example, a camera configured to image the driver, and the vehicle internal information detection unit 12040 may calculate a level of fatigue or concentration of the driver or determine whether or not the driver is asleep, on the basis of detected information input from the driver state detection unit 12041.

The microcomputer 12051 calculates, on the basis of the information inside and outside the vehicle acquired by the vehicle external information detection unit 12030 or the vehicle internal information detection unit 12040, a control target value for the driving force generation device, steering mechanism, or braking device and output a control command to the drive system control unit 12010. For example, in order to achieve an advanced driver assistance system (ADAS) functions, the microcomputer 12051 performs cooperative control, the ADAS including vehicle collision avoidance or impact mitigation, follow-up traveling based on a distance between vehicles, traveling at a constant vehicle speed, vehicle collision warning, vehicle lane departure warning, or the like.

Furthermore, the microcomputer 12051 controls the driving force generation device, the steering mechanism, the braking device, or the like on the basis of information around the vehicle acquired by the vehicle external information detection unit 12030 or the vehicle internal information detection unit 12040 to perform cooperative control, for example, for automatic drive enabling autonomous travel without depending on the driver's operation.

Furthermore, the microcomputer 12051 is operable to output a control command to the body system control unit 12020, on the basis of information outside the vehicle acquired by the vehicle external information detection unit 12030. For example, the microcomputer 12051 is operable to control the head lamps according to a position of a preceding vehicle or oncoming vehicle detected by the vehicle external information detection unit 12030 to perform cooperative control for antidazzle, for example, by switching the head lamps from high beam to low beam.

The audio image output unit 12052 transmits at least one of an audio output signal or visual output signal to an output device configured to notify a vehicle occupant or outside the vehicle of visual or audible information. In the example of FIG. 18, an audio speaker 12061, a display unit 12062, and an instrument panel 12063 are illustrated as the output device. For example, the display unit 12062 may include at least one of an on-board display or a head-up display.

Figure 19:
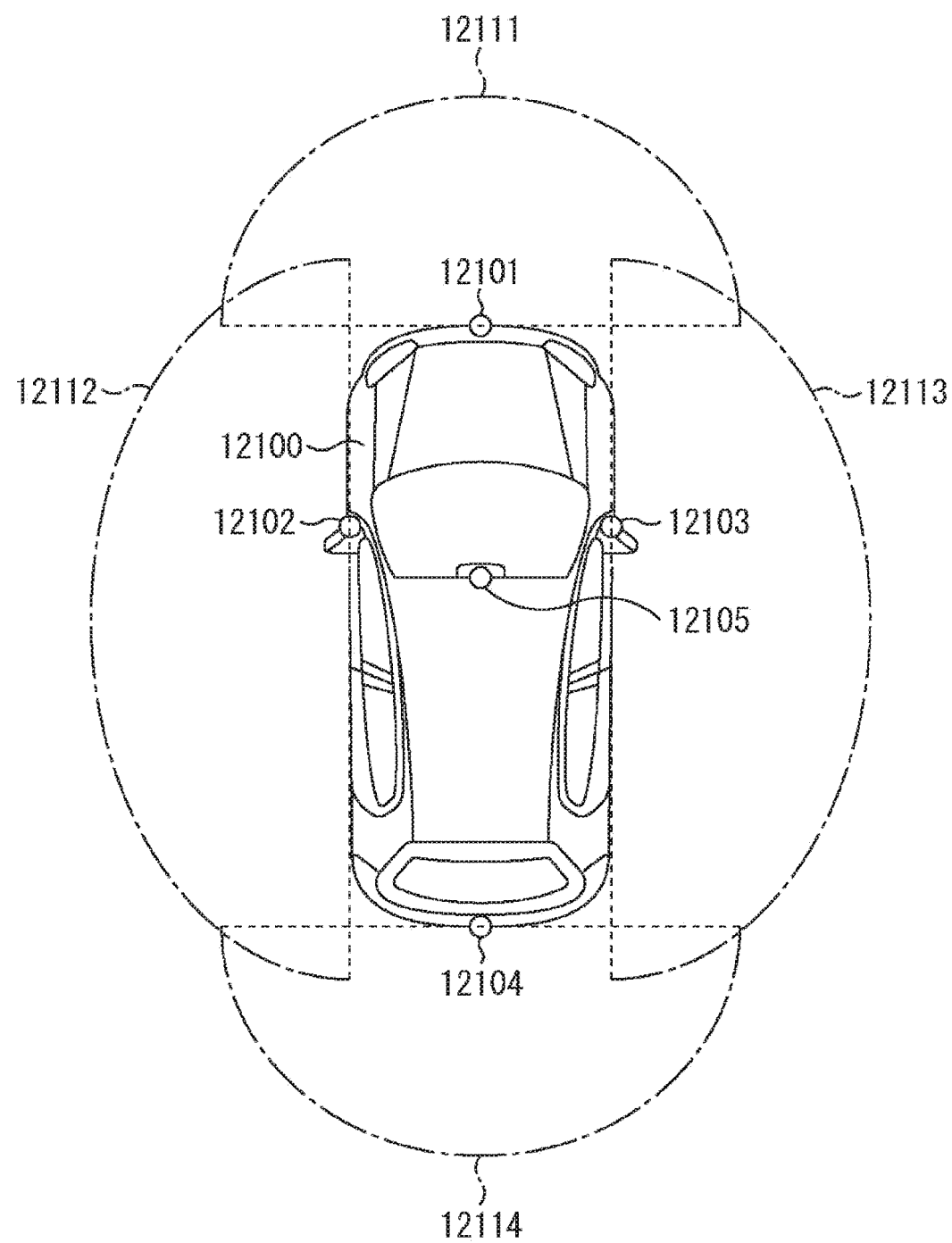
FIG. 19 is an explanatory diagram illustrating an example of installation positions of a vehicle external information detection unit and imaging units.

FIG. 19 is a diagram illustrating an example of installation positions of the imaging unit 12031.

In FIG. 19, a vehicle 12100 includes imaging units 12101, 12102, 12103, 12104, and 12105 as the imaging unit 12031.

The imaging units 12101, 12102, 12103, 12104, and 12105 are provided at positions, such as a front nose, outside mirrors, a rear bumper, a back door, and an upper portion of a windshield on the vehicle interior side, of the vehicle 12100, for example. The imaging unit 12101 provided at the front nose and the imaging unit 12105 provided at the upper portion of the windshield on the vehicle interior side each mainly acquire a forward image of an area in front of the vehicle 12100. The imaging units 12102 and 12103 provided at the outside mirrors each mainly acquire a side image of an area on each side of the vehicle 12100. The imaging unit 12104 provided at the rear bumper or the back door mainly acquires an image of an area in back of the vehicle 12100. The forward images of areas in front of the vehicle acquired by the imaging units 12101 and 12105 are mainly used for detecting a preceding vehicle, pedestrian, obstacle, traffic light, traffic sign, lane, or the like.

Note that FIG. 19 illustrates an example of imaging ranges of the imaging units 12101 to 12104. An imaging range 12111 indicates an imaging range of the imaging unit 12101 provided in the front nose, imaging ranges 12112 and 12113 indicate imaging ranges of the imaging units 12102 and 12103 provided at the outside mirrors, respectively, and an imaging range 12114 indicates an imaging range of the imaging unit 12104 provided at the rear bumper or the back door. For example, by superimposing image data captured by the imaging units 12101 to 12104, an overhead view image when the vehicle 12100 is viewed from above is obtained.

At least one of the imaging units 12101 to 12104 may have a function of acquiring distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114, and a temporal change in each distance (speed relative to the vehicle 12100), on the basis of the distance information obtained from the imaging units 12101 to 12104, and extracts, in particular, a three-dimensional object nearest on a travel path of the vehicle 12100 and traveling at a predetermined speed (e.g., 0 km/h or more) in substantially the same direction of the vehicle 12100, as a preceding vehicle. Furthermore, the microcomputer 12051 sets a distance between the vehicles to be secured in advance with respect to the preceding vehicle to perform automatic brake control (including following stop control), automatic acceleration control (including following start control), or the like. As described above, cooperative control for automatic drive or the like enabling autonomous travel without depending on the driver's operation can be performed.

For example, on the basis of the distance information obtained from the imaging units 12101 to 12104, the microcomputer 12051 classifies three-dimensional object data about three-dimensional objects into three-dimensional objects, such as a two-wheeled motorcycle, ordinary motor vehicle, large-sized motor vehicle, pedestrian, and others object such as a power pole and extracts the three-dimensional objects, for use in automatic avoidance of obstacles. For example, the microcomputer 12051 identifies obstacles around the vehicle 12100 between an obstacle which is visible to the driver of the vehicle 12100 and an obstacle which is difficult for the driver to see. Then, the microcomputer 12051 determines a collision risk indicating the risk of collision with each obstacle, and in a case where the risk of collision has a value equal to or more than a set value and there is a possibility of collision, the microcomputer 12051 outputs warning to the driver via the audio speaker 12061 or the display unit 12062 or performs forced deceleration or evasive steering via the drive system control unit 12010, and thus, driving assistance for collision avoidance can be performed.

At least one of the imaging units 12101 to 12104 may be an infrared camera configured to detect infrared light. For example, the microcomputer 12051 enables pedestrian recognition by determining whether or not the pedestrian is present in an image captured by the imaging units 12101 to 12104. Such pedestrian recognition is performed, for example, according to a procedure for extracting feature points in images captured by the imaging units 12101 to 12104 as the infrared camera and a procedure for determining whether or not a series of feature points indicating a contour of an object after pattern matching thereof represents a pedestrian. When the microcomputer 12051 determines that a pedestrian is in images captured by the imaging units 12101 to 12104 and recognizes the pedestrian, the audio image output unit 12052 controls the display unit 12062 to display a rectangular emphasis contour line to be superimposed on the recognized pedestrian. Furthermore, the audio image output unit 12052 may control the display unit 12062 to display an icon or the like indicating a pedestrian at a desired position.

Heretofore, an example of the vehicle control system to which the technology according to the present disclosure is applicable has been described. The technology according to the present disclosure is applicable to the imaging unit 12031 (including the imaging units 12101 to 12104) of the configurations described above. Specifically, the solid-state imaging device having the structure of FIG. 5 is applicable to the imaging unit 12031 (including the imaging units 12101 to 12104). By applying the technology according to the present disclosure to the imaging unit 12031 (including the imaging units 12101 to 12104), it is expected to efficiently capture incident light to improve sensitivity while maintaining the effect of suppressing noise generation.

Note that in the present specification, the above steps describing a series of processing include not only processing performed in time series according to the described sequence, but also processing not always performed in time-series but performed parallelly or individually.

Furthermore, embodiments of the present disclosure are not limited to the above embodiments and various modifications and variations may be made within the scope of the present disclosure.

In addition, in the above description, a configuration described as one device (or processing unit) may be divided into a plurality of devices (or processing units). On the contrary, a configuration described above as a plurality of devices (or processing units) may be combined into one device (or processing unit). Furthermore, a configuration other than the configurations described above may be added to a configuration of each device (or each processing unit). Furthermore, if the configuration and operation of a system are substantially unchanged as a whole, part of the configuration of a certain device (or processing unit) may be included in the configuration of another device (or another processing unit). In other words, the present technology is not intended to be limited to the above-mentioned embodiments, and various modifications and variations may be made without departing from the scope and spirit of the present technology.

As described above, preferable embodiments of the present disclosure has been described in detail with reference to the accompanying drawings but the present disclosure is not limited to such examples. Those skilled in the art may obviously find various alternation and modification examples within the technical ideas as set forth in the scope of the appended claims, and it should be understood that they will naturally come under the technical scope of the present invention.

It should be noted that the present technology also may include the following configurations.

(1) A solid-state imaging device including:
a memory that is located on a side opposite from a light receiving surface and formed in the same substrate of Si as a photoelectric conversion element; and
a bottom light-shielding film that is formed at a bottom portion of a hole defined by digging the Si deep from the light receiving surface, at a position where the memory is formed.

(2) The solid-state imaging device according to (1), further including
a light-transmitting film that is formed to fill the hole over the bottom light-shielding film in the hole.

(3) The solid-state imaging device according to (2), in which
the light-transmitting film includes a material having a refractive index smaller than a refractive index of the Si.

(4) The solid-state imaging device according to (2) or (3), in which
the light-transmitting film includes an oxide film.

(5) The solid-state imaging device according to any of (1) to (4), further including
a top light-shielding film that is formed on part of the light-transmitting film after the light-transmitting film is planarized.

(6) The solid-state imaging device according to (5), further including
a digging light-shielding film that is formed by digging the light-transmitting film to connect the top light-shielding film and the bottom light-shielding film.

(7) The solid-state imaging device according to any of (1) to (6), further including
an embedded light-shielding film that is formed by being embedded near the memory from a side opposite from the light receiving surface.

(8) The solid-state imaging device according to (7), in which
the bottom light-shielding film is formed to be connected to the embedded light-shielding film.

(9) The solid-state imaging device according to (1), in which
the bottom light-shielding film is formed to fill the hole entirely.

(10) The solid-state imaging device according to any of (1) to (9), further including
a global shutter function.

(11) An electronic device including:
a solid-state imaging device that includes:
   a memory that is located on a side opposite from a light receiving surface and formed in the same substrate of Si as a photoelectric conversion element; and a bottom light-shielding film that is formed at a bottom portion of a hole defined by digging the Si deep from the light receiving surface, at a position where the memory is formed;
a signal processing circuit configured to process an output signal output from the solid-state imaging device; and
an optical system configured to input incident light into the solid-state imaging device.

REFERENCE SIGNS LIST

1 Solid-state imaging device
2 Pixel
11 Semiconductor substrate
50 Surface pinning layer
51 Planarization film
52 Wiring
53 Light-shielding film
54 Electrode
55 Insulating film
56 Memory
57 Si
58 Oxide film
60 Planarization film
61 Filter film
62 Resin film
63 OCL
70 Insulating film
71 Oxide film
81 Photoresist
91 Light-shielding film
92 Digging light-shielding film
101 Light-shielding film
111 Light-shielding film

What is claimed is:

1. A solid-state imaging device, comprising:
a memory that is located on a side opposite from a light receiving surface and formed in a same substrate of Si as a photoelectric conversion element;
a bottom light-shielding film that is formed at a bottom portion of a hole defined by digging the Si deep from the light receiving surface, at a position where the memory is formed;
a light-transmitting film that is formed to fill the hole over the bottom light-shielding film in the hole;
a top light-shielding film that is formed on part of the light-transmitting film after the light-transmitting film is planarized; and
a digging light-shielding film that is formed by digging the light-transmitting film to connect the top light-shielding film and the bottom light-shielding film.

2. The solid-state imaging device according to claim 1, wherein the light-transmitting film includes a material having a refractive index smaller than a refractive index of the Si.

3. The solid-state imaging device according to claim 2, wherein the light-transmitting film includes an oxide film.

4. The solid-state imaging device according to claim 1, further comprising an embedded light-shielding film that is formed by being embedded near the memory from a side opposite from the light receiving surface.

5. The solid-state imaging device according to claim 4, wherein the bottom light-shielding film is formed to be connected to the embedded light-shielding film.

6. The solid-state imaging device according to claim 1, wherein the bottom light-shielding film is formed to fill the hole entirely.

7. The solid-state imaging device according to claim 1, further comprising a global shutter function.

8. An electronic device, comprising:
a solid-state imaging device that includes:
a memory that is located on a side opposite from a light receiving surface and formed in a same substrate of Si as a photoelectric conversion element;
a bottom light-shielding film that is formed at a bottom portion of a hole defined by digging the Si deep from the light receiving surface, at a position where the memory is formed;
a light-transmitting film that is formed to fill the hole over the bottom light-shielding film in the hole;
a top light-shielding film that is formed on part of the light-transmitting film after the light-transmitting film is planarized; and
a digging light-shielding film that is formed by digging the light-transmitting film to connect the top light-shielding film and the bottom light-shielding film;
a signal processing circuit configured to process an output signal output from the solid-state imaging device; and
an optical system configured to input incident light into the solid-state imaging device.

9. The electronic device according to claim 8, wherein the light-transmitting film includes a material having a refractive index smaller than a refractive index of the Si.

10. The electronic device according to claim 9, wherein the light-transmitting film includes an oxide film.

11. The electronic device according to claim 8, further comprising an embedded light-shielding film that is formed by being embedded near the memory from a side opposite from the light receiving surface.

12. The electronic device according to claim 11, wherein the bottom light-shielding film is formed to be connected to the embedded light-shielding film.

13. The electronic device according to claim 8, wherein the bottom light-shielding film is formed to fill the hole entirely.

14. The electronic device according to claim 8, further comprising a global shutter function.

* * * * *